United States Patent
Sugiura et al.

(10) Patent No.: US 7,595,696 B2
(45) Date of Patent: Sep. 29, 2009

(54) POWER AMPLIFIER

(75) Inventors: Masayuki Sugiura, Kanagawa-ken (JP); Yasuhiko Kuriyama, Kanagawa-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 91 days.

(21) Appl. No.: 11/615,171

(22) Filed: Dec. 22, 2006

(65) Prior Publication Data

US 2007/0159246 A1 Jul. 12, 2007

(30) Foreign Application Priority Data

Dec. 26, 2005 (JP) ............................. 2005-371513

(51) Int. Cl.
*H03F 1/52* (2006.01)
(52) U.S. Cl. ..................................... 330/298; 330/207 P
(58) Field of Classification Search ............... 330/207 P, 330/285, 296, 298
See application file for complete search history.

(56) References Cited

U.S. PATENT DOCUMENTS 6,043,714 A 3/2000 Yamamoto et al.

2005/0218990 A1 10/2005 Makioka
2006/0017509 A1* 1/2006 Veitschegger ............... 330/285
2007/0120602 A1* 5/2007 Kuroda ....................... 330/254

FOREIGN PATENT DOCUMENTS

| CN | 86107071 A | 3/1987 |
|---|---|---|
| CN | 101002379 A | 7/2007 |
| JP | 8-236637 | 9/1996 |
| JP | 2001-274636 | 10/2001 |
| JP | 2003-23084 | 1/2003 |

* cited by examiner

*Primary Examiner*—Khanh V Nguyen
(74) *Attorney, Agent, or Firm*—Oblon, Spivak, McClelland, Maier & Neustadt, P.C.

(57) ABSTRACT

A power amplifier including an active device having at least one heterjunction bipolar transistor based on a compound semiconductor; a diode connected between the base and the emitter of the bipolar transistor in reverse direction with respect to the base-emitter diode; a resistor connected in series between one electrode of the diode and the base of the bipolar transistor; and a bias circuit connected between the diode and the resistor, wherein the bipolar transistor includes a plurality of transistors, and each transistor is connected to the bias circuit via a resistor connected to a base of the transistor. The bias circuit may include an emitter follower circuit having a bipolar transistor.

19 Claims, 8 Drawing Sheets

POWER AMPLIFIER

CROSS-REFERENCE TO RELATED APPLICATIONS

This application is based upon and claims the benefit of priority from the prior Japanese Patent Application No. 2005-371513, filed on Dec. 26, 2005; the entire contents of which are incorporated herein by reference.

BACKGROUND OF THE INVENTION

1. Field of the Invention

This invention relates to a power amplifier having an ESD protection circuit and formed on a semiconductor chip based on bipolar transistors.

2. Background Art

In recent years, there is a growing demand for downsizing on compact information devices as typified by mobile phones. Small peripheral components (such as chip capacitors and inductors) are incorporated and modularized into corresponding key components, and the number of peripheral components is being reduced. Thus such modules are directly exposed to the external environment. What particularly matters in this situation is the tolerance to ESD (electrostatic discharge). ESD is a phenomenon in which electric charge accumulated in a device or human body external to a circuit is instantaneously discharged to the circuit. When a circuit is installed in a device or is in use, electric charge is inevitably produced due to the motion of the device or human body. Therefore, in a device exposed to the external environment, it is necessary to ensure ESD tolerance on the circuit side.

The main cause of ESD breakdown is believed to be thermal breakdown due to the instantaneous flow of electric charge accumulated at high energy (high potential) into the circuit. Thus the ESD protection circuit serves to prevent the high-energy electric charge from flowing into the thermally weak semiconductor device.

Conventionally, a circuit having such function is realized by a circuit having a diode connected in series between a terminal to be protected and a ground terminal for passing current when a prescribed voltage is exceeded. When a voltage above the turn-on voltage of the diode is applied to its terminal, the diode becomes conducting to prevent electric charge from flowing into the circuit to be protected. Here, the prescribed voltage needs to be set to a value higher than voltages required for operation of the circuit such as the power supply voltage and the operating voltage. To this end, a plurality of stages of diodes are used as disclosed in JP 2003-023084A.

However, this type of circuit has a problem that the diode itself constituting the protection circuit is broken by the inflow of high energy. To prevent this, it may be contemplated as disclosed in JP 8-236637A that a resistor is inserted in series with the protection device (such as a diode) to cause voltage drop and reduce current flowing into the protection device. In this case, the voltage drop increases as the value of resistance increases, and thereby the tolerance is improved. However, because energy inflow to the protection circuit side is disturbed, the operation as a protection circuit becomes uncertain. Thus a resistor with several to ten and several ohms is required. Furthermore, because the resistor itself must withstand large energy loss, it is necessary to use a resistor having a high current capacity realized by a semiconductor rather than a resistor having a small current capacity realized by a metal thin film.

However, the value of sheet resistance of a semiconductor resistor is ten and several $\Omega/\square$ even with high-concentration doping. To achieve several $\Omega$ requires a large aspect ratio, which consumes a large area on the chip. Then the chip area is increased, and the increase of packaging area adversely affects downsizing. Furthermore, when the wafer price is high as in the case of compound semiconductors, there is also a problem of cost.

As described above, conventional diode-connected circuits require a large area for achieving high ESD tolerance and have problems in pellet size and cost.

On the other hand, JP 2001-274636A discloses an amplifier which is excellent in uniformity of current distribution in spite of a small ballast resistance and has high efficiency and low distortion, exhibiting little deterioration of distortion even when a digital modulation wave is input thereto. This amplifier is a high frequency power amplifier based on bipolar transistors, comprising at least two or more blocks. Each block includes a bias generation circuit for generating a base bias potential and a capacitor device for high frequency input. Each bias generation circuit comprises a second bipolar transistor for impedance conversion and a diode circuit having a current mirror transistor, the diode circuit being subjected to constant current biasing for temperature detection.

SUMMARY OF THE INVENTION

According to an aspect of the invention, there is provided a power amplifier including: an active device having at least one heterojunction bipolar transistor based on a compound semiconductor; a diode connected between the base and the emitter of the bipolar transistor in reverse direction with respect to the base-emitter diode; a resistor connected in series between the diode and the base of the bipolar transistor; and a bias circuit connected between the diode and the resistor.

According to other aspect of the invention, there is provided a power amplifier including: an active device having at least one heterojunction bipolar transistor based on a compound semiconductor; a diode connected between the base and the emitter of the bipolar transistor in reverse direction with respect to the base-emitter diode; two resistors connected in series between the diode and the base of the bipolar transistor; and a bias circuit connected between the two resistors.

According to other aspect of the invention, there is provided a power amplifier including: a substrate; an active device region provided on the substrate and having at least one heterojunction bipolar transistor based on a compound semiconductor; a diode region provided on the substrate and including a diode connected between the base and the emitter of the bipolar transistor in reverse direction with respect to the base-emitter diode; a resistor region provided on the substrate and including a resistor connected in series between one electrode of the diode and the base of the bipolar transistor; a device isolation region provided on the substrate for isolating the active device region, the diode region, and the resistor region; and a power supply terminal provided on the substrate and connected between the diode and the resistor.

DETAILED DESCRIPTION OF THE INVENTION

Embodiments of the invention will now be described.

First Embodiment

The first embodiment is described with reference to FIGS. 1 to 5 and 8.

Figure 3:
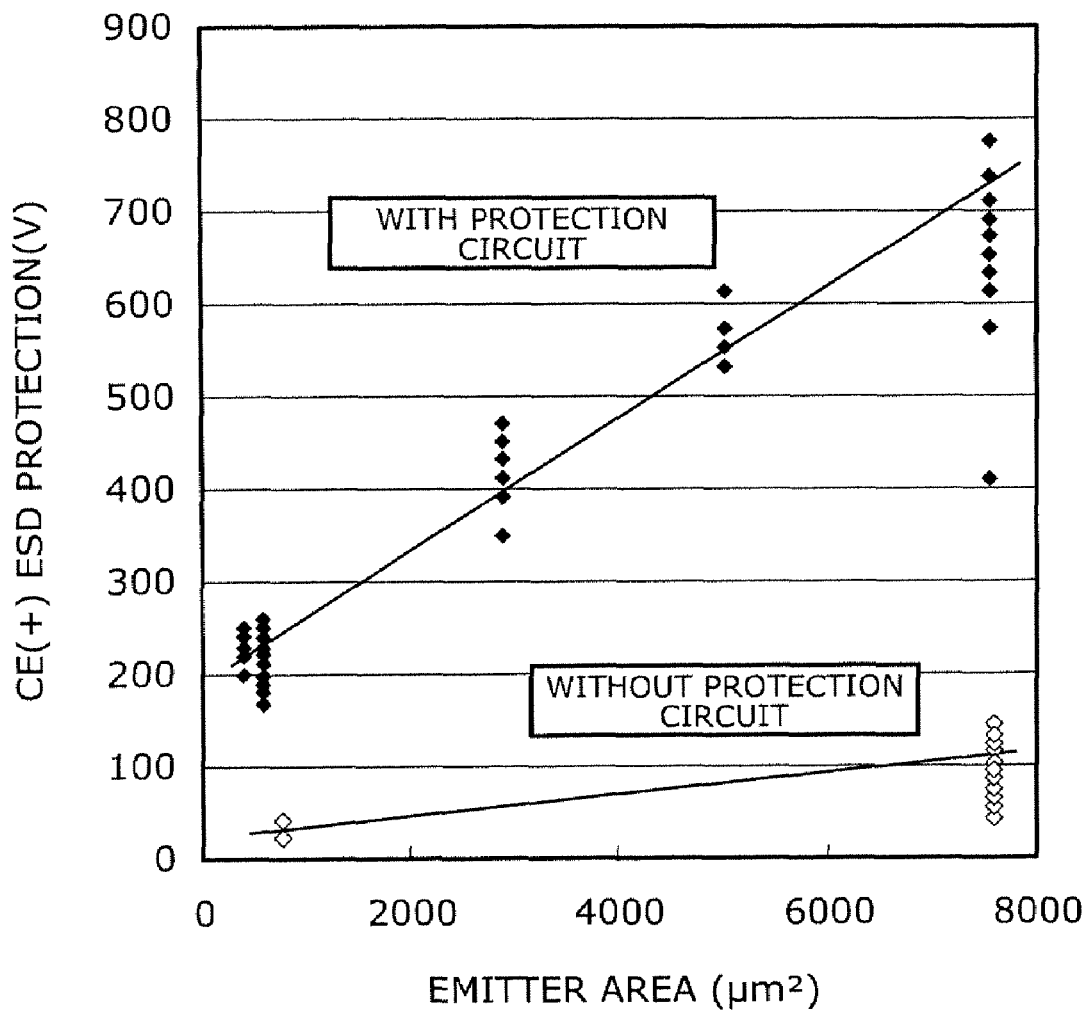
FIG. 3 is a characteristic diagram showing the result of an ESD tolerance test (positive side) for the power amplifier of FIG. 1.
Figure 4:
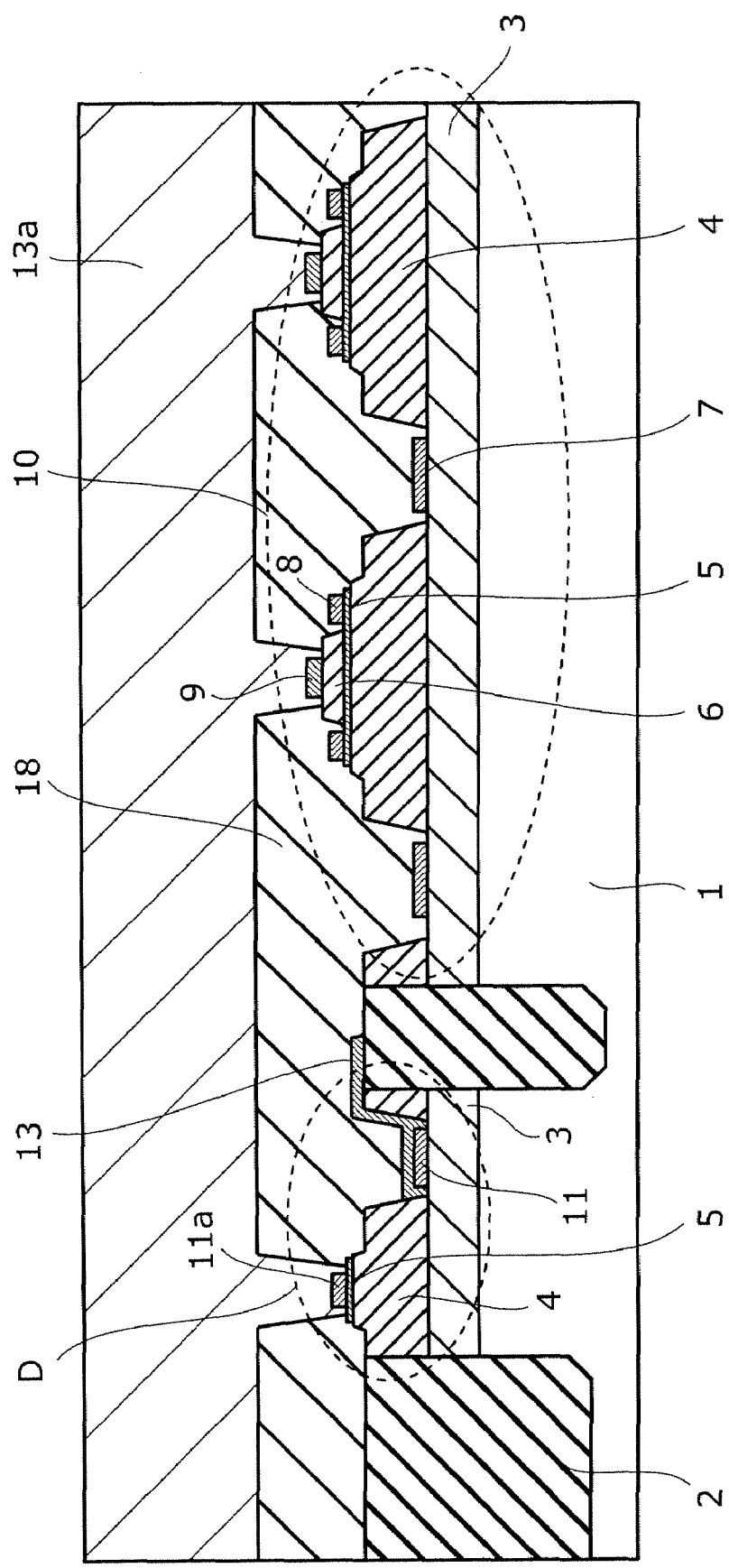
FIG. 4 is a cross section of a semiconductor chip having the bipolar transistor and the diode of the power amplifier shown in FIG. 1.
Figure 5:
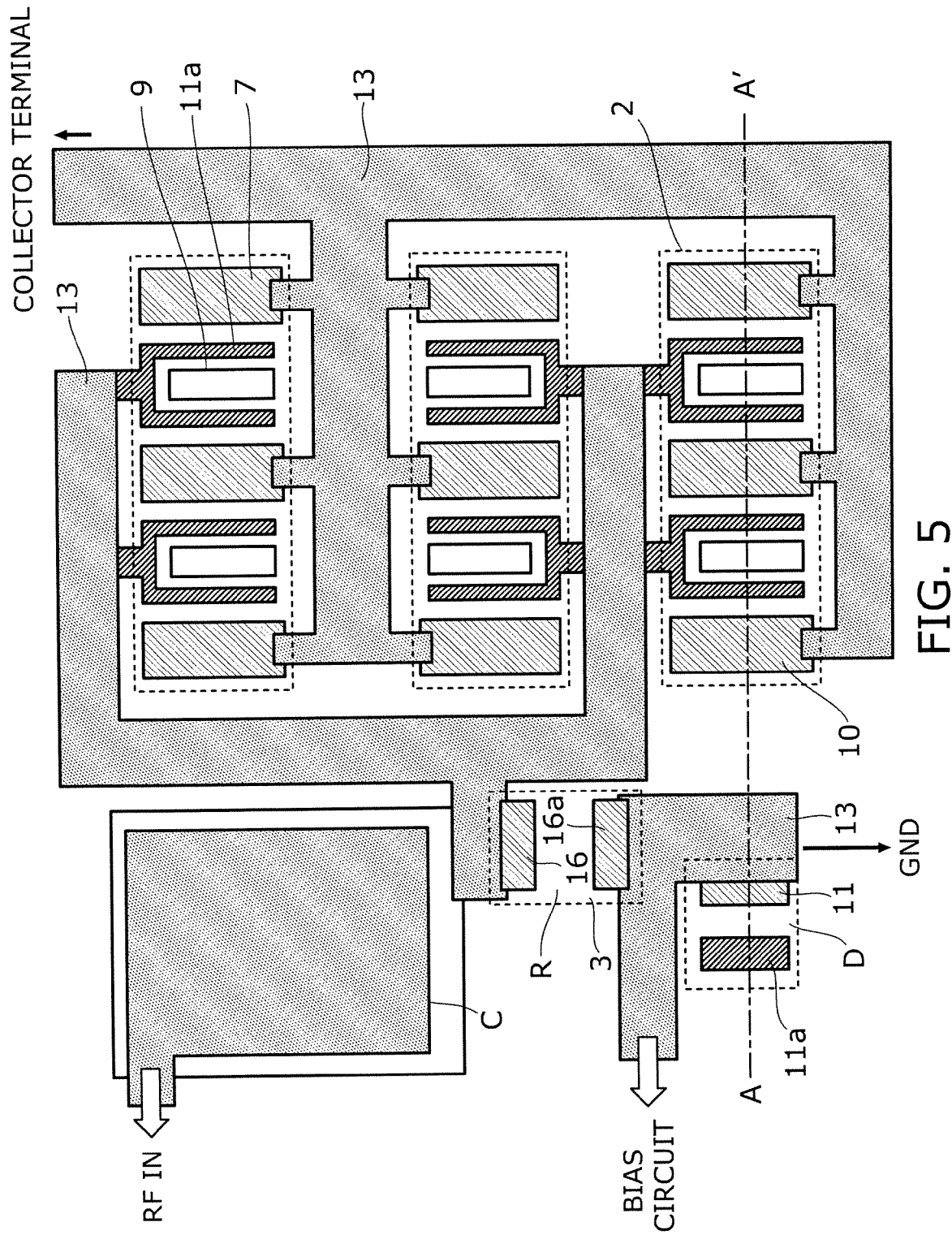
FIG. 5 is a plan view of the semiconductor chip shown in FIG. 4.
Figure 8:
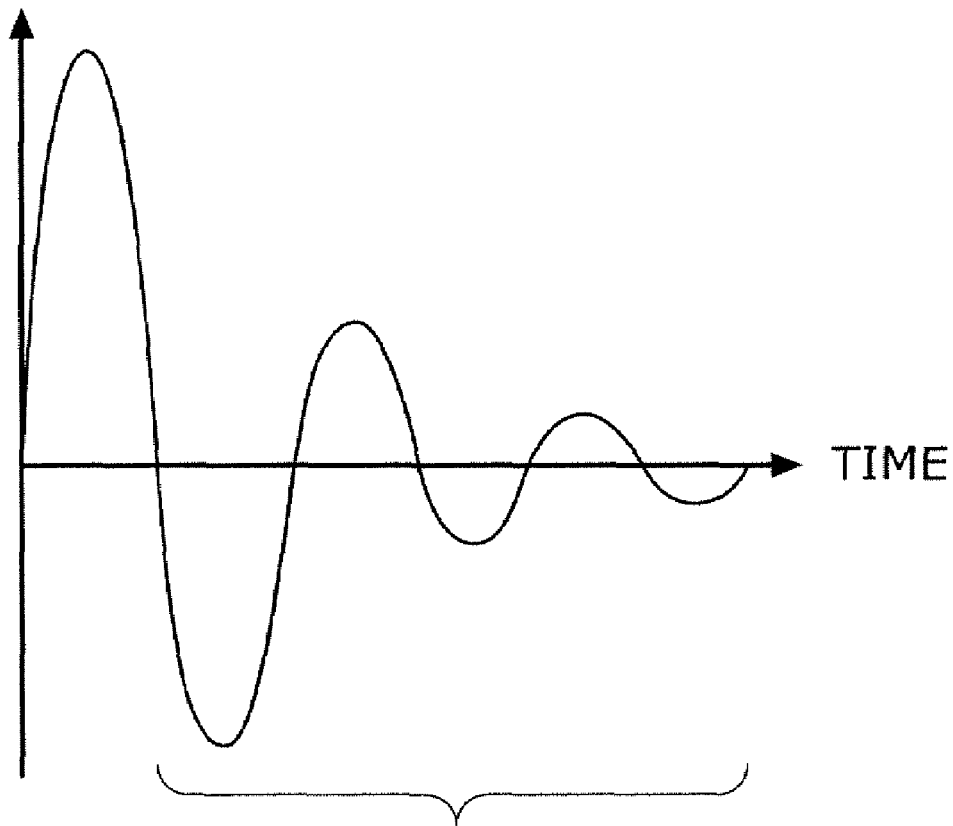
FIG. 8 is a characteristic diagram illustrating the generation of negative voltage due to ringing.

FIG. 1 is a circuit diagram of a power amplifier formed on a semiconductor substrate according to this embodiment. FIG. 2 is a characteristic diagram showing the result of an ESD tolerance test (negative side) in this embodiment. FIG. 3 is a characteristic diagram showing the result of an ESD tolerance test (positive side). FIG. 4 is a cross section of a semiconductor chip having the bipolar transistor and the diode of the power amplifier shown in FIG. 1. FIG. 5 is a plan view of the semiconductor chip shown in FIG. 4. FIG. 8 is a characteristic diagram illustrating the generation of negative voltage due to ringing. The cross section taken along line A-A' in FIG. 5 is shown in FIG. 4. For simplicity of description, FIG. 5 does not show the insulating film 18 and the interconnect layer (second metal) 13a shown in FIG. 4.

As shown in FIGS. 4 and 5, the semiconductor substrate with a semiconductor chip formed thereon comprises a GaAs semi-insulating substrate, on which an epitaxial growth layer is laminated. A heterojunction bipolar transistor (hereinafter referred to as HBT) is provided in this laminated structure. An $n^+$-GaAs epitaxial layer 3 having a high-concentration collector region and an $n^-$-GaAs epitaxial layer 4 having a low-concentration collector region are successively formed directly on the GaAs semi-insulating substrate 1. A base region (p-GaAs epitaxial layer) 5 and an emitter region ($n^-$-InGaP epitaxial layer) 6 are successively laminated on the low-concentration collector region of the epitaxial layer 4. The emitter region 6, the collector region 4, and the base region 5 collectively constitute an npn-bipolar transistor 10. On this HBT 10, a collector electrode 7 is formed on the collector region constituting the epitaxial layer 3, a base electrode 8 on the base region 5, and an emitter electrode 9 on the emitter region 6.

A diode D is formed on the semiconductor substrate 1. The diode D is connected between the base region 5 and the emitter region 6 in reverse to the base-emitter diode. The diode D is composed of the epitaxial layer constituting the base region 5 and the epitaxial layer 4. Electrodes 11, 11a are formed on the epitaxial layer 3 and on the base region 5, respectively (see FIG. 4). The epitaxial layer 3 between electrodes 16 and 16a constitutes a resistor R (see FIG. 5). Furthermore, a MIM capacitor C is provided on the semiconductor substrate. The MIM capacitor C uses a metal interconnect layer (first metal) 13 as one of its electrodes and a silicon nitride film or other interlayer insulating film (not shown) as its dielectric.

As shown in FIGS. 4 and 5, the HBT 10, the diode D, and the resistor R are formed in a device region defined by a device isolation region. The HBT 10 and the diode D are covered with an interlayer insulating film 18 made of polyimide or the like. The emitter electrode 9 of the HBT 10 and the electrode 11a of the diode D are electrically connected to the metal interconnect layer (second metal) 13a formed on the interlayer insulating film 18. As shown in FIG. 5, the electrodes 16, 16a of the resistor R are electrically connected to the metal interconnect layer (first metal) 13 formed on the interlayer insulating film (not shown). Furthermore, a plurality of HBTs 10 are formed on the semiconductor substrate. While FIG. 1 is a circuit diagram having one HBT in the circuit to be protected, this embodiment may include more than one HBT (the amplifier of FIG. 5 corresponds to this circuit diagram).

Next, the circuit configuration of the power amplifier of this embodiment is described with reference to FIG. 1A. The circuit to be protected is shown as including one HBT 10, and the other configuration of the circuit to be protected is not shown. The HBT 10 of the circuit to be protected has a collector terminal 12 coupled to the collector 4 and a ground terminal 14 coupled to the emitter 6. A bias circuit 17 is coupled to the base 5. A ballast resistor R of about 4Ω, for example, for the bias circuit 17 is inserted between the bias circuit 17 and the base 5. The base 5 is connected to the input circuit of an external RF circuit via the MIM capacitor C. The bias circuit 17 is connected also to the emitter 6. A diode D is inserted between the bias circuit 17 and the emitter 6 or between the bias circuit 17 and the ground terminal 14 in the reverse direction with respect to the base-emitter junction. According to this configuration, the resistor R can prevent the diode D from being broken by ESD.

As compared with the power amplifier having a protection circuit (series circuit of a resistor and a diode) of FIG. 1, ESD tolerance in the case of no protection circuit is determined by a negative voltage applied to the collector terminal of the transistor in the circuit to be protected. The value of the voltage is about −30 V. In this case, the base-emitter pn-junction is damaged by ESD and loses the function of a transistor.

In this embodiment, a diode with a size of 10 μm×30 μm serving as an ESD protection device is placed between the base and the emitter of the HBT. The diode is formed from the base region and the collector region of the HBT. Thus no additional wafer structure or process is required for forming the diode. Furthermore, a resistor is connected in series as a protection resistor for the diode. This can prevent damage to the device in the case of negative ESD by allowing discharge through the current path shown in the figure.

Moreover, to configure a circuit, an appropriate bias voltage needs to be applied to the base terminal of the transistor. In particular, a high power circuit such as a power amplifier may be based on a technique of inserting a resistor, called a ballast resistor, between the bias circuit and the base terminal for ensuring thermal stability. When the HBT is about to fall into thermal runaway and to allow a large current to flow into the base terminal of the transistor, the ballast resistor serves to cause voltage drop and lower the bias point of the transistor which would otherwise lead to thermal runaway. This embodiment has a circuit configuration where the ballast resistor also serves as a diode protection resistor. Thus, addition of an ESD protection circuit requires no additional devices other than the diode. Therefore the increase of the chip area can be reduced. Furthermore, insertion of the protection resistor also prevents the diode itself from being broken by ESD. Thus the required ESD tolerance can be ensured.

Figure 1A:
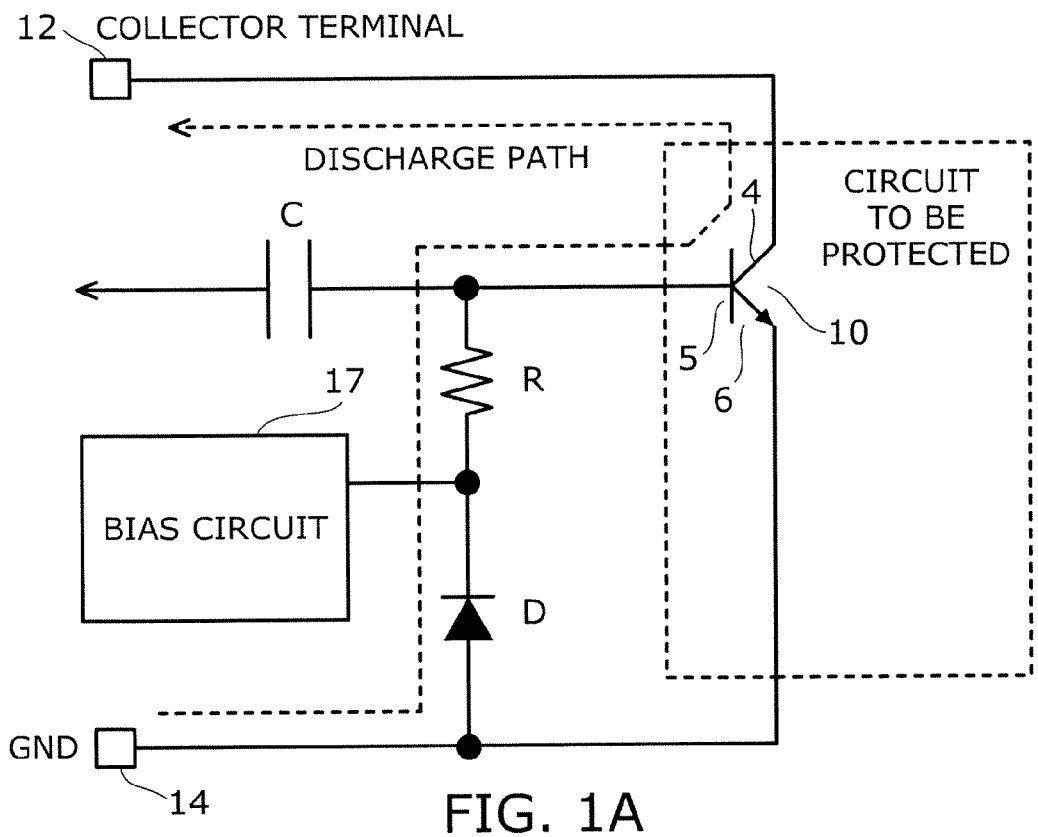
FIGS. 1A and 1B are circuit diagrams of a power amplifier formed on a semiconductor substrate according to a first embodiment of the invention.
Figure 2:
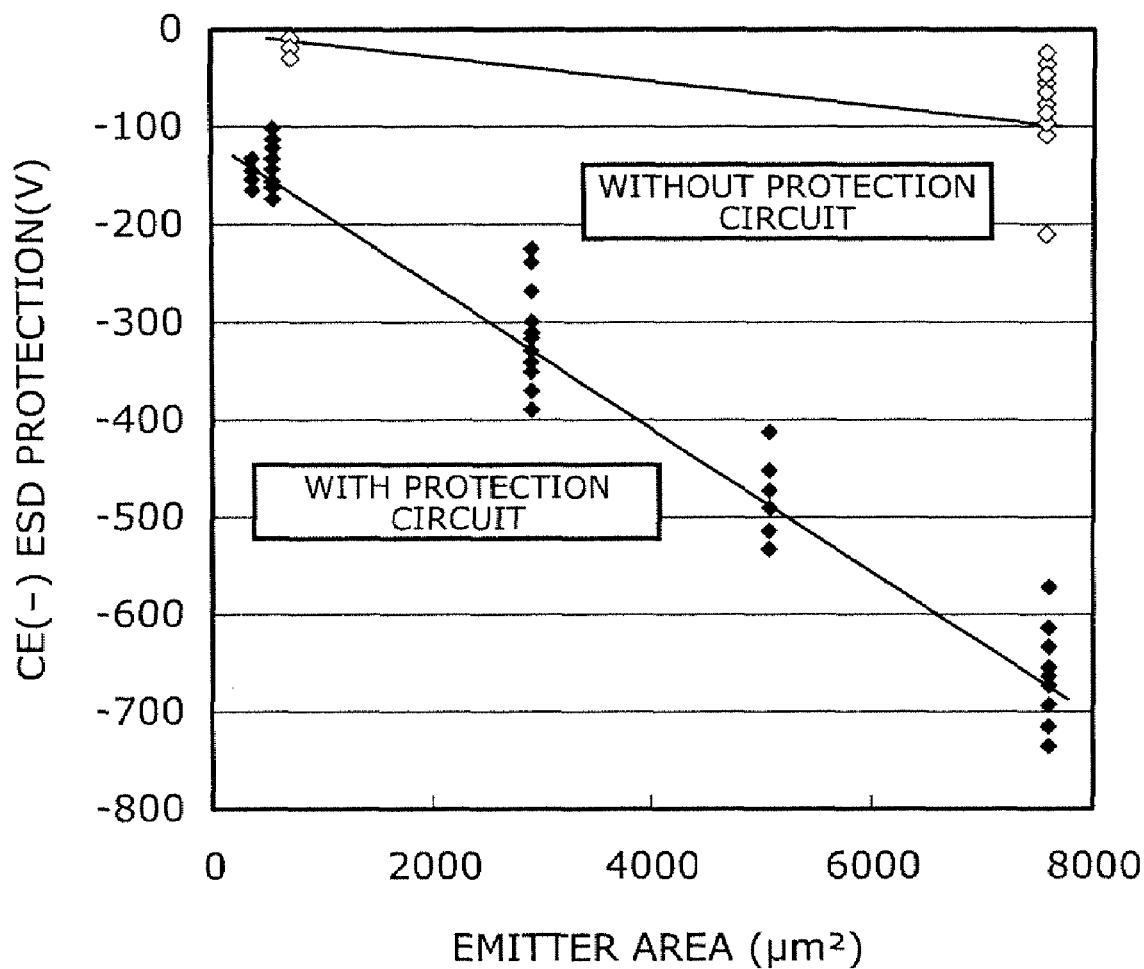
FIG. 2 is a characteristic diagram showing the result of an ESD tolerance test (negative side) for the power amplifier of FIG. 1.

FIG. 2 shows the result of an ESD test conducted by using the protection circuit shown in FIG. 1A. Because a transistor is used in the ESD discharge path, the withstand capability depends on the size of the transistor. However, it is seen that the withstand capability is higher than in the case of no protection circuit. It is also seen that, because a ballast resistor is used as a protection resistor, the circuit achieves, without an additional protection resistor, a withstand capability of over −400 V, which is the withstand capability of an ESD protection diode itself.

Furthermore, the base-emitter diode configured as a heterojunction for improving the characteristics of the HBT transistor allows the pn-junction to achieve steeper switching than the base-emitter junction formed by homojunction. Here, the base-emitter diode has the tendency to cause steep (hard) breakdown for ESD with relatively low reverse voltages.

On the other hand, at the base-collector junction, a collector layer doped with low concentration is formed for reducing the base-collector parasite capacitance. Therefore the base-collector junction has the form of a pin-diode. As a result, the base-collector junction has high ESD tolerance irrespective of whether it is homojunction or heterojunction.

Because of such HBT characteristics, only a protection circuit for protecting the base-emitter junction is inserted in this embodiment. As shown in FIG. 1A, this protection circuit is configured with only a protection path for negative ESD. However, because the base-collector junction has high ESD tolerance, the withstand capability for positive ESD is also effectively improved. Specifically, as described above, even in the case of no protection circuit, the base-collector diode of the HBT has high ESD withstand capability also against reverse applied voltage and does not result in breakdown. However, the applied ESD waveform exhibits ringing due to an external circuit (inductance component), and the voltage waveform is also caused to swing into the negative side even when the voltage is applied to the positive side (see FIG. 8). Thus the base-emitter diode is broken because of its insufficient withstand capability. Consequently, in spite of the ESD withstand capability test on the positive side, the breakdown of the base-emitter junction having a small ESD withstand capability on the negative side determines the ESD withstand capability on the positive side. In this embodiment, because an ESD protection circuit with a protection resistor is formed between the base and the emitter, the base-emitter junction is protected even under the influence of ringing. As a result, a high withstand capability can be achieved also on the positive side.

FIG. 3 shows the experimental verification of improved withstand capability for positive ESD that is achieved even when the current path for ESD is prepared only on the negative side. With regard to breakdown locations, it is found that the base-emitter diode is broken, suggesting that the ESD withstand capability is determined by the principle described above. In this case again, the effect of the protection resistor remains unchanged. The protection circuit of this embodiment achieves high withstand capability for both positive and negative ESD.

As described above, the ESD tolerance of an HBT-based circuit can be significantly improved both on the positive and negative side simply by protecting the base-emitter junction. Thus it is possible to provide a protection circuit achieving high ESD tolerance while solving the problem of increased cost and area in the conventional circuits.

While FIG. 1A shows a single HBT in the circuit to be protected, the circuit to be protected shown in FIG. 5 has a plurality of HBTs. These HBTs have common terminals (collector terminal and ground terminal) and a common bias circuit. The bias circuit is connected to the base of each HBT via a ballast resistor. Therefore any number of one or more HBTs can be used in the circuit to be protected in this embodiment.

Figure 1B:
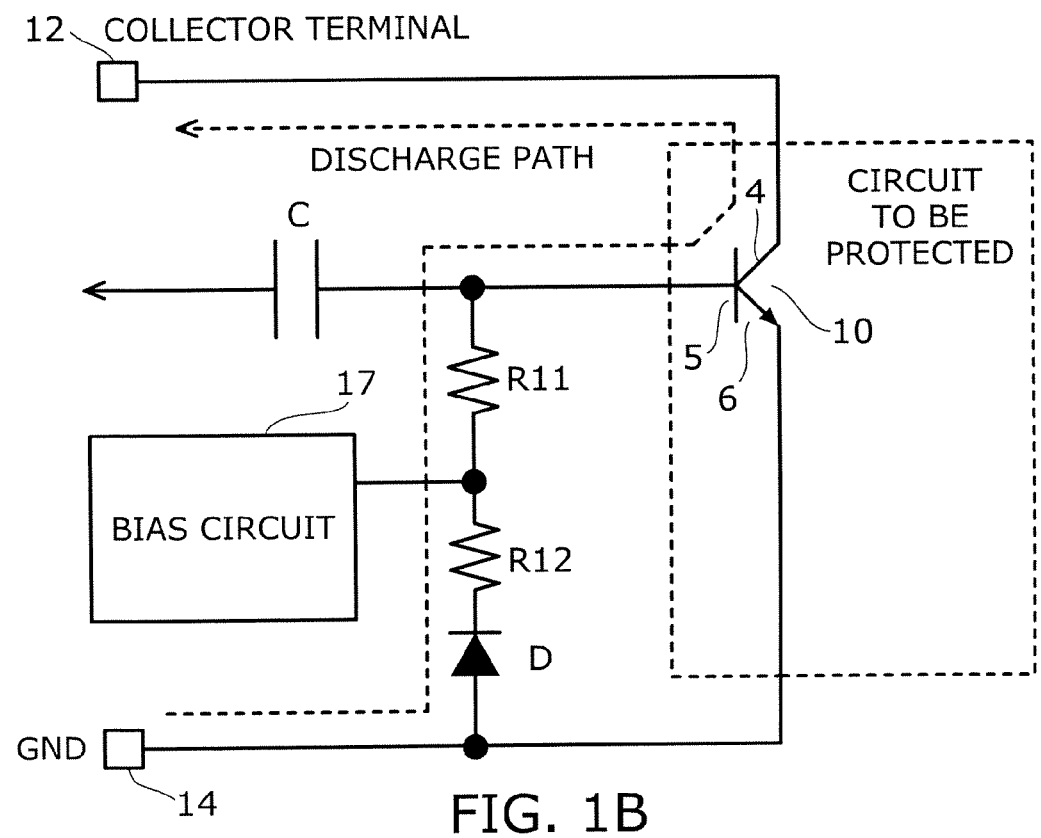

Here, a circuit configuration having separately a ballast resistor and a diode protection resistor is described. FIG. 1B is a circuit diagram thereof. The ballast resistor R11 has a resistance value determined so as to prevent thermal runaway of the bipolar transistor. To prevent thermal runaway, R11 is preferably 1Ω or more. Furthermore, to improve breakdown tolerance while maintaining the operation of the protection circuit against high energy, the sum of the additional diode resistance R12 and the ballast resistance R11, R11+R12, is preferably 3 to 7Ω. Thus the ballast resistance R11 and the additional diode resistance R12 can be appropriately determined. For example, by setting R11 to 4Ω and R12 to 2Ω, the circuit can be protected against high energy while preventing thermal runaway. Thus the breakdown tolerance of the diode can be improved.

Second Embodiment

The second embodiment is described with reference to FIG. 6.

Figure 6:
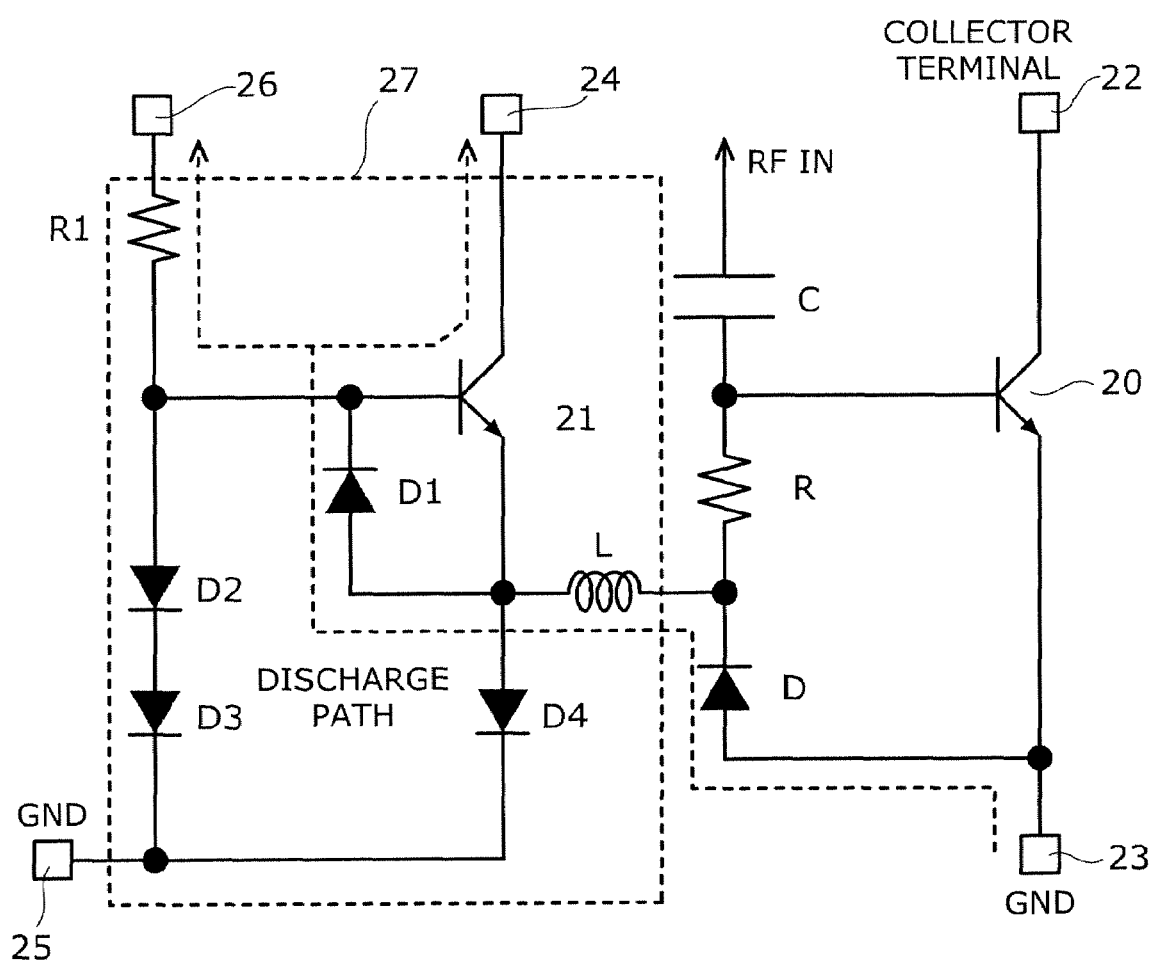
FIG. 6 is a circuit diagram of a power amplifier formed on a semiconductor substrate according to a second embodiment of the invention.

FIG. 6 is a circuit diagram of a power amplifier formed on a semiconductor substrate according to this embodiment. The protection circuit of the second embodiment, which has a circuit configuration similar to that of the first embodiment, is characterized in that an emitter follower circuit is used as a bias circuit.

Next, the circuit configuration of the power amplifier of this embodiment is described with reference to FIG. 6. The circuit to be protected is shown as including one HBT 20, and the other configuration is not shown. The HBT 20 of the circuit to be protected has a collector terminal 22 coupled to the collector and a ground terminal 23 coupled to the emitter. A bias circuit 27 is coupled to the base. A ballast resistor R of about 4Ω, for example, for the bias circuit is inserted between the bias circuit 27 and the base. A diode D is inserted between the bias circuit 27 and the emitter or between the bias circuit 27 and the ground terminal 23 in the reverse direction with respect to the base-emitter junction. According to this configuration, the resistor R can prevent the diode D from being broken by ESD. The base of the transistor 20 is connected to the input circuit of an external RF circuit via the MIM capacitor C. One end of the resistor R is connected between the MIM capacitor C and the base 5, and the other end is connected to the bias circuit 27.

As compared with the power amplifier having a protection circuit (series circuit of a resistor and a diode) of FIG. 6, in the case of no protection circuit, ESD tolerance of the transistor in the circuit to be protected is determined by a negative voltage applied to the collector terminal. The value of the voltage is about −30 V. In this case, the base-emitter pn-junction is damaged by ESD and loses the function of a transistor.

In this embodiment, a diode D with a size of 10 μm×30 μm serving as an ESD protection device is placed between the base and the emitter of the HBT. The diode D is formed from the base region and the collector region of the HBT formed on the semiconductor substrate. Thus no additional wafer structure or process is required for forming the diode. Furthermore, a resistor R is connected in series as a protection resistor for the diode D. This can prevent damage to the device in the case of negative ESD by allowing discharge through the collector terminal.

In a high power circuit such as a power amplifier, a ballast resistor is inserted between the bias circuit and the base terminal for ensuring thermal stability. In this embodiment, the ballast resistor also serves as a diode protection resistor. Thus, addition of an ESD protection circuit requires no additional devices other than the diode. Therefore the increase of the chip area can be reduced. Furthermore, insertion of the protection resistor also prevents the diode itself from being broken by ESD. Thus the required ESD tolerance can be ensured.

The bias circuit is further described with reference to FIG. 6.

The bias circuit 27 of FIG. 6 comprises a bipolar transistor 21. The bipolar transistor 21 has a collector terminal 24 coupled to the collector, a ground terminal 25 coupled to the emitter, and a control terminal 26 coupled to the base. A diode D1 is inserted between the base and the emitter of the bipolar transistor 21 in the reverse direction with respect to the base-emitter junction. A diode D4 is inserted between the emitter of the bipolar transistor 21 and the ground terminal 25. Diodes D2, D3 are inserted between the base of the bipolar transistor 21 and the ground terminal 25. The diode D1 is connected between the diode D2 and the base of the bipolar transistor 21.

The control terminal 26 is connected between the diodes D1 and D2 via a resistor R1. A coil L connected between the emitter of the bipolar transistor 21 and the diode D4 is connected between the diode D and the resistor R that are connected between the base and the emitter of the bipolar transistor 20.

In the emitter follower circuit constituting the bias circuit 27, the ESD withstand capability for the collector terminal 24 is the lowest. Therefore a protection circuit is required for the collector terminal 24. In this embodiment, a diode D1 is connected as a protection circuit between the base and the emitter of the emitter follower circuit. The discharge path upon application of negative ESD to the collector terminal 24 of the emitter follower circuit is indicated by a dotted arrow.

Because this discharge path includes a plurality of diodes (diodes D, D1), it has a parasite resistance component. This component can serve as a protection resistance. Thus it is not necessary to additionally insert a protection resistance. Conversely, the direct connection of the protection diode to the circuit advantageously improves the withstand capability. Protection for negative ESD to the control terminal 26 is also achieved.

As described above, in addition to the advantageous effect described in the first embodiment, this embodiment also achieves a protection effect on the bias circuit. Thus the circuit as a whole can achieve higher ESD tolerance.

Third Embodiment

The third embodiment is described with reference to FIG. 7.

Figure 7:
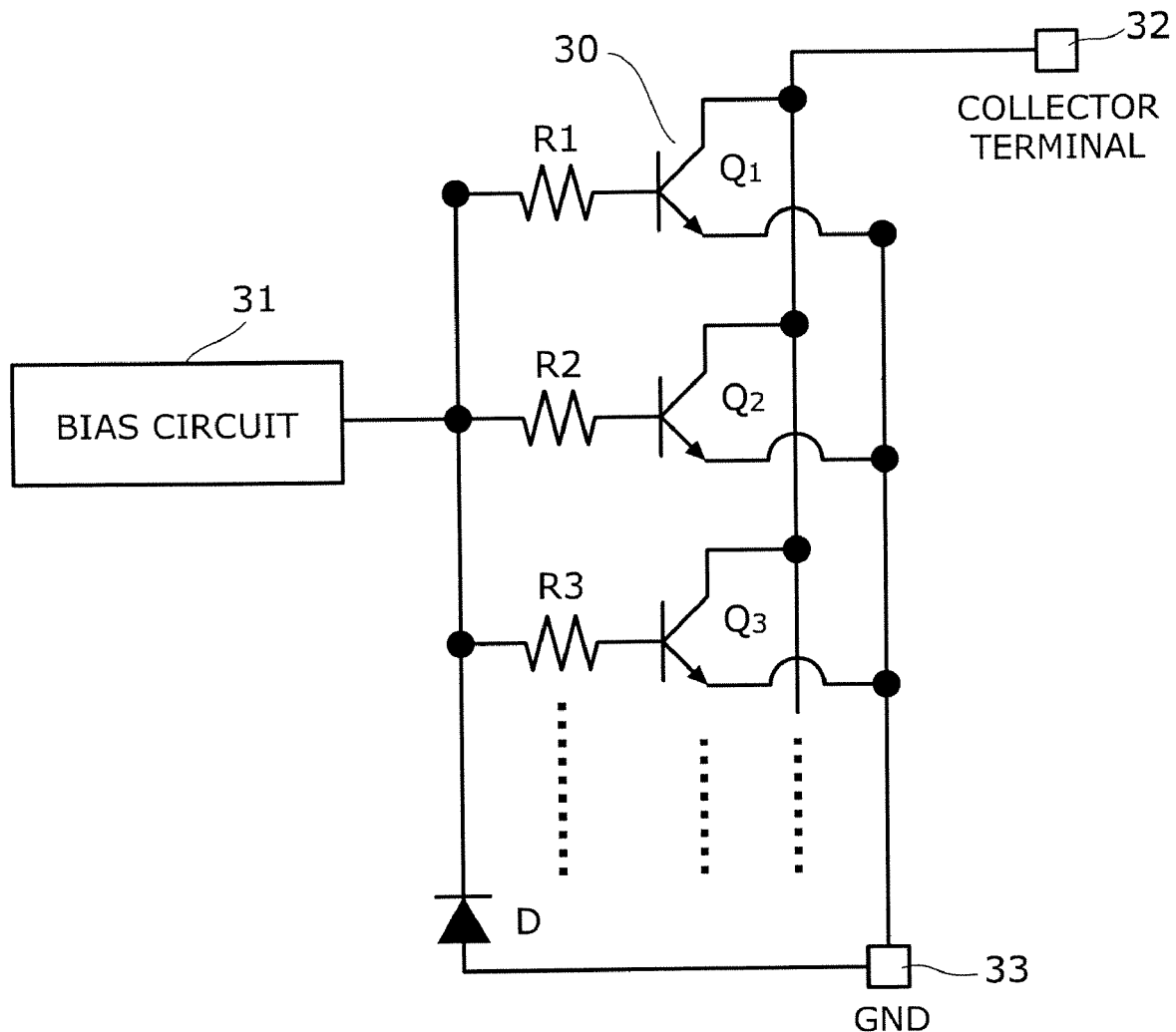
FIG. 7 is a circuit diagram of a power amplifier formed on a semiconductor substrate according to a third embodiment of the invention.

FIG. 7 is a circuit diagram of a power amplifier formed on a semiconductor substrate according to this embodiment. The circuit to be protected is shown as including HBTs 30, and the other configuration is not shown. The HBTs 30 comprise a plurality of HBTs Q1, Q2, Q3, . . . . The HBTs 30 have a common collector terminal 32 connected to the collector of each HBT Q1, Q2, Q3, . . . and a common ground terminal 33 connected to the emitter of each HBT Q1, Q2, Q3, . . . . The base of each HBT Q1, Q2, Q3, . . . is connected to the bias circuit 31.

In this embodiment, ballast resistors R1, R2, R3, . . . for the bias circuit 31 are each inserted between the bias circuit 31 and the base of each HBT Q1, Q2, Q3, . . . . The ballast resistors R1, R2, R3, . . . are used as a protection resistor. One end of the ballast resistor R1, R2, R3, . . . is connected to the base of the HBT Q1, Q2, Q3, . . . , respectively. To the other end is connected a diode D in the reverse direction with respect to the base-emitter junction. According to this configuration, the ballast resistors R1, R2, R3, . . . can prevent the diode D from being broken by ESD. The plan view of the semiconductor substrate of FIG. 5 described in the first embodiment shows one ballast resistor R for a plurality of HBTs. However, in the present embodiment, although not shown, ballast resistors are formed so that a ballast resistor is connected to the base of each HBT on the semiconductor substrate.

In this embodiment, like the first and second embodiment, the diode is formed from the base region and the collector region of the HBT. Thus no additional wafer structure or process is required for forming the diode. Furthermore, a resistor is connected in series as a protection resistor for the diode. This can prevent damage to the device in the case of negative ESD by allowing discharge.

Moreover, to configure a circuit, an appropriate bias voltage needs to be applied to the base terminal of the transistor. In particular, a high power circuit such as a power amplifier may be based on a technique of inserting a resistor, called a ballast resistor, between the bias circuit and the base terminal for ensuring thermal stability. When the HBT is about to fall into thermal runaway and to allow a large current to flow into the base terminal of the transistor, the ballast resistor serves to cause voltage drop and lower the bias point of the transistor which would otherwise lead to thermal runaway. This embodiment has a circuit configuration where the ballast resistor also serves as a diode protection resistor.

The invention claimed is:

1. A power amplifier comprising:
    an active device having at least one heterojunction bipolar transistor based on a compound semiconductor;
    a diode connected between the base and the emitter of the bipolar transistor in reverse direction with respect to the base-emitter diode;
    a resistor connected in series between one electrode of the diode and the base of the bipolar transistor; and
    a bias circuit connected between the diode and the resistor;
    wherein the bipolar transistor comprises a plurality of transistors, and each transistor is connected to the bias circuit via a resistor connected to the base of the transistor.

2. The power amplifier according to claim 1, wherein the resistor has 3Ω or more and 7Ω or less.

3. The power amplifier according to claim 1, wherein the compound semiconductor includes GaAs.

4. A power amplifier comprising:
    an active device having at least one heterojunction bipolar transistor based on a compound semiconductor;
    a diode connected between the base and the emitter of the bipolar transistor in reverse direction with respect to the base-emitter diode;
    a resistor connected in series between one electrode of the diode and the base of the bipolar transistor; and
    a bias circuit connected between the diode and the resistor,
    wherein the bias circuit comprises an emitter follower circuit having a bipolar transistor.

5. The power amplifier according to claim 4, wherein a diode is connected between the base and the emitter of the bipolar transistor of the emitter follower circuit in reverse direction with respect to the base-emitter diode.

6. A power amplifier comprising:
an active device having at least one heterojunction bipolar transistor based on a compound semiconductor;
a diode connected between the base and the emitter of the bipolar transistor in reverse direction with respect to the base-emitter diode;
two resistors connected in series between one electrode of the diode and the base of the bipolar transistor; and
a bias circuit connected between the two resistors.

7. The power amplifier according to claim 6, wherein the bipolar transistor comprises a plurality of transistors, and each transistor is connected to the bias circuit via a resistor connected to the base of the transistor.

8. The power amplifier according to claim 6, wherein the bias circuit comprises an emitter follower circuit having a bipolar transistor.

9. The power amplifier according to claim 8, wherein a diode is connected between the base and the emitter of the bipolar transistor of the emitter follower circuit in reverse direction with respect to the base-emitter diode.

10. The power amplifier according to claim 6, wherein the compound semiconductor includes GaAs.

11. The power amplifier according to claim 6, wherein the sum of resistance of the two resistors is 3Ω or more and 7Ω or less.

12. A power amplifier comprising:
a substrate;
an active device region provided on the substrate and having at least one heterojunction bipolar transistor based on a compound semiconductor;
a diode region provided on the substrate and including a diode connected between the base and the emitter of the bipolar transistor in reverse direction with respect to the base-emitter diode;
a resistor region provided on the substrate and including a resistor connected in series between one electrode of the diode and the base of the bipolar transistor;
a device isolation region provided on the substrate for isolating the active device region, the diode region, and the resistor region; and
a power supply terminal provided on the substrate and connected to the resistor.

13. The power amplifier according to claim 12, wherein the bipolar transistor comprises a plurality of transistors, and each transistor is connected to the power supply terminal via a resistor connected to the base of the transistor.

14. The power amplifier according to claim 12, further comprising:
a signal input terminal; and
a capacitor, wherein
one electrode of the capacitor is connected to the base and one end of the resistor, and
the other electrode of the capacitor is connected to the signal input terminal.

15. The power amplifier according to claim 12, wherein the power supply terminal is connected between the resistor and the diode.

16. The power amplifier according to claim 12, wherein the resistor comprises two resistors, and the power supply terminal is connected between the two resistors.

17. The power amplifier according to claim 12, wherein the substrate comprises GaAs.

18. The power amplifier according to claim 12, wherein the heterojunction bipolar transistor has a collector of GaAs, a base of GaAs, and an emitter of InGaP.

19. The power amplifier according to claim 12, further comprising:
an organic insulating film having an opening for exposing at least the other electrode of the diode and an electrode of the emitter; and
a metal layer covering the opening and the organic insulating film, wherein
the electrode of the emitter is connected to the other electrode of the diode via the metal layer.

* * * * *